United States Patent [19]
Miyamoto

[11] Patent Number: 5,648,929
[45] Date of Patent: Jul. 15, 1997

[54] FLASH MEMORY CARD

[75] Inventor: Taiyuu Miyamoto, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 505,541

[22] Filed: Jul. 21, 1995

[30] Foreign Application Priority Data

Mar. 23, 1995 [JP] Japan .................................. 7-064001

[51] Int. Cl.$^6$ ............................................ G11C 13/00
[52] U.S. Cl. ................................ 365/185.04; 365/185.11; 365/185.29; 365/185.33; 365/218; 365/230.03
[58] Field of Search ........................ 365/185.04, 185.11, 365/185.29, 185.33, 218, 230.03

[56] References Cited

U.S. PATENT DOCUMENTS

| | | | |
|---|---|---|---|
| 5,224,070 | 6/1993 | Fandrich et al. | 365/185.04 X |
| 5,267,218 | 11/1993 | Elbert | 365/185.04 |
| 5,301,161 | 4/1994 | Landgraf et al. | 365/185.04 |
| 5,341,330 | 8/1994 | Wells et al. | 365/185.04 X |
| 5,363,334 | 11/1994 | Alexander et al. | 365/185.04 |

OTHER PUBLICATIONS

Series 2 Flash Memory Cards, Oct. 1992, pp. 4–91, 4–95–4–96.

*Primary Examiner*—Do Hyun Yoo
*Attorney, Agent, or Firm*—Lowe, Price, LeBlanc & Becker

[57] ABSTRACT

Addresses for a plurality of consecutive logic blocks are managed by assigning the addresses to their corresponding addresses for physical blocks of a plurality of flash memory devices such that the addresses for the plurality of continuous logic blocks are respectively distributed into the plurality of flash memory devices. When block erase commands are inputted from the outside, chip enable signals are respectively transmitted to at least two of the flash memory devices in which physical blocks to be erased exist, in such a manner that a period in which at least two flash memory devices simultaneously perform block erase operations, exists.

15 Claims, 9 Drawing Sheets

| MODE | FUNCTION | $\overline{REG}$ | $\overline{CE2}$ | $\overline{CE1}$ | A0 |
|---|---|---|---|---|---|
|  | STANDBY | X | H | H | X |
| ① | BYTE ACCESS | H | H | L | L |
| ② |  | H | H | L | H |
| ③ | WORD ACCESS | H | L | L | X |
| ④ | ODD-NUMBERED BYTE ACCESS | H | L | H | X |

FIG. 11 (PRIOR ART)

FLASH MEMORY CARD

BACKGROUND OF THE INVENTION

1. Field of the Invention

The present invention relates to a flash memory card with flash memory ICs mounted therein, which is suitable for use in a flash memory having a memory capacity of 4M bytes or more and is capable of performing a block erase operation.

2. Description of the Related Art

Mass-storage flash memories have been used in recent years as non-volatile auxiliary memories for a computer or the like. In a flash memory card having such memory ICs incorporated therein, the memories are erased on a block basis.

Figure 6:
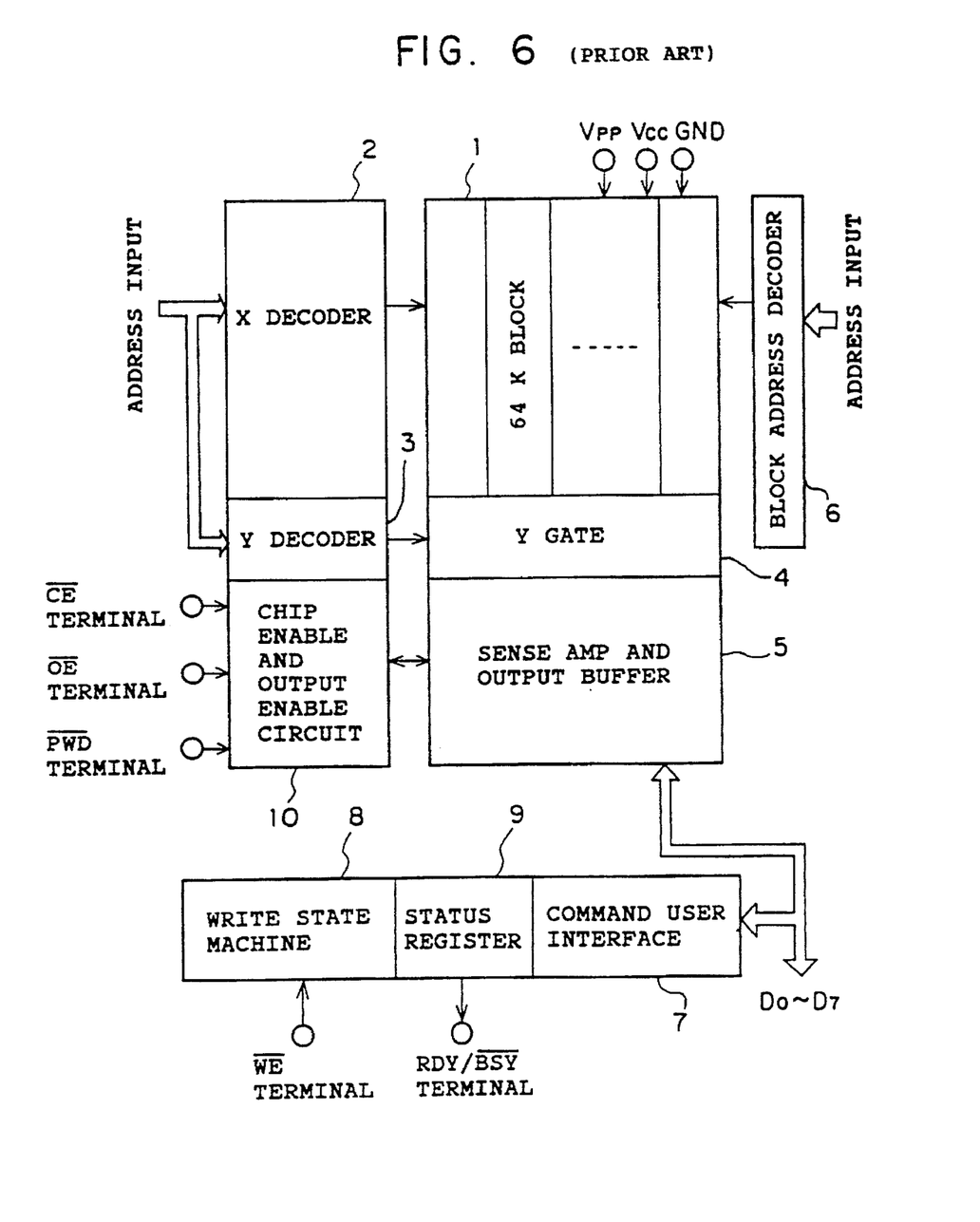
FIG. 6 is a view illustrating a configuration of a conventional flash memory IC.

FIG. 6 is a view illustrating a configuration of a conventional flash memory IC. In the same drawing, there are shown a memory array 1, an X decoder 2 for performing decoding in an X direction of the memory array 1 from an address input, a Y decoder 3 for performing decoding in a Y direction of the memory array 1 from the address input, a Y gate 4, a sense amplifier/output buffer 5 used for the memory array 1, and a block address decoder 6 for designating a block address from the address input. The memory array 1 has a capacity of 8M bytes and is divided into sixteen 64K byte blocks. Write and erase operations can be carried out every blocks of the memory array 1.

Further, the flash memory IC is provided with a command user interface 7 for accepting and executing a command issued from a user, a write state machine 8 for controlling program (write) and erase operations, a status register 9 in which a state of the flash memory IC is written therein, and a chip-enable and output-enable circuit 10 for performing controls such as chip enable, output enable, etc. The command user interface 7 and the write state machine 8 perform an operation corresponding to the command issued from the user. The completion of the write or erase operation can be recognized by internally reading out the status register 9 or externally referring to ready/busy (RDY/BSY) terminals varied according to the state of the status register 9.

Further, when a signal of an "H" level is supplied to a Vpp terminal, write and block-erase operations can be performed. When a signal of an "L" level is supplied to a power down (PWD) terminal, the flash memory IC is brought to a deep power-down mode so that current consumption is extremely reduced. In the drawings employed in the present application, bars are respectively placed over the names of low active signals.

Figure 7:
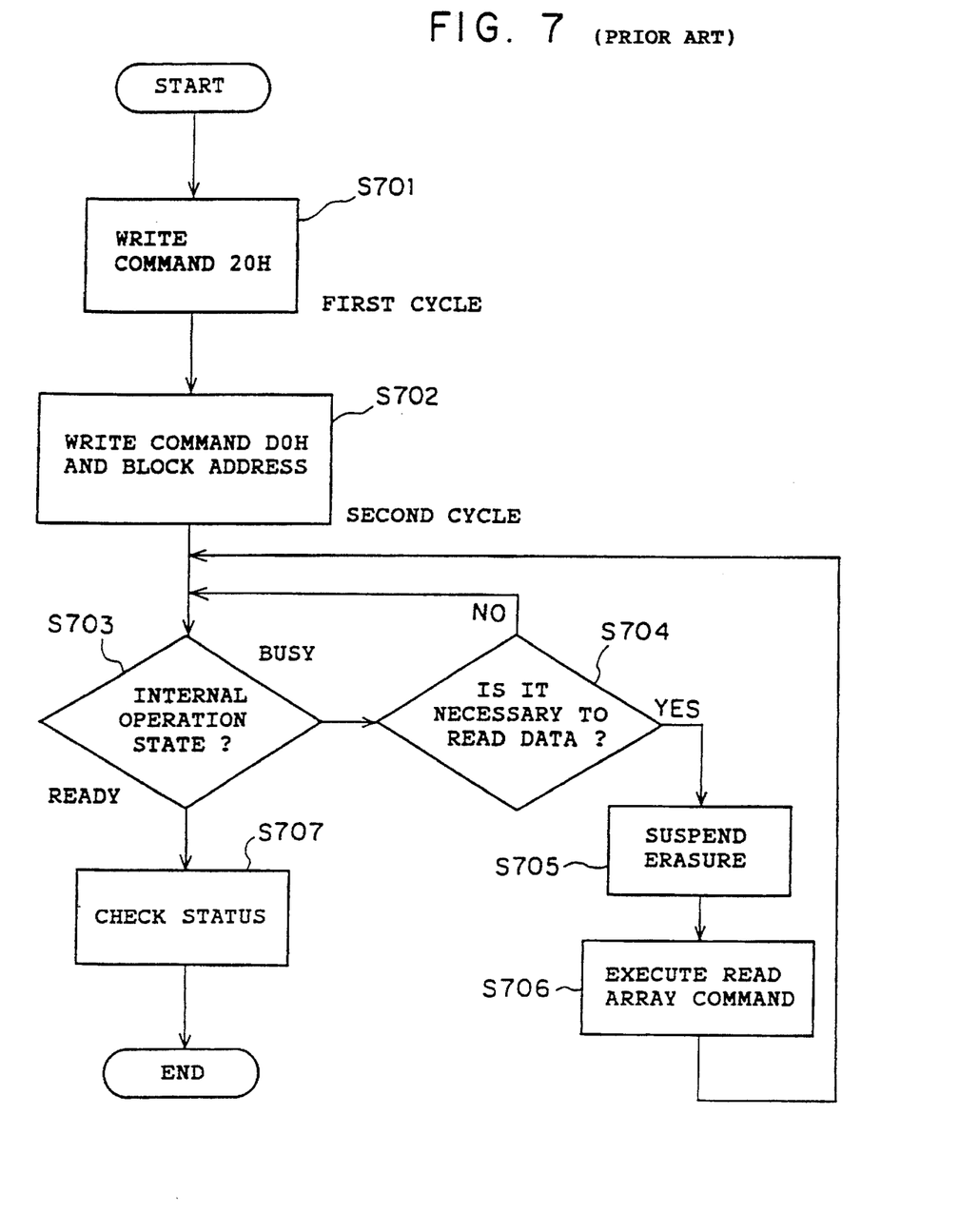
FIG. 7 is a flowchart for describing the operation of erasing blocks in the flash memory IC shown in FIG. 6.

The block erase operation of the memory IC will now be described. FIG. 7 is a flowchart for describing the operation of the memory IC at the time of block erasure. The block erasure is executed as shown in the same drawing. Namely, a set-up command "20H" is written in a first cycle (Step S701) and an erase command "DOH" and a block address to be erased are written in the next cycle (Step S702). The block erasure is started by writing these data. When the memory IC is in the block erase operation, the inside of the memory IC is busy and hence program (write) and block-erase operations or the like cannot be executed on other blocks. However, if the reading of data from the memory is required (Step S704) even when the internal state of the memory IC is busy during the erase operation of the memory (Step S703), then the erase operation is temporarily suspended based on an erase suspend command (Step S705) and data about blocks other than the blocks which are in the erase suspend are read based on a read array command (Step S706). When the internal state of the memory IC is ready in Step S703, the completion of erasure can be confirmed by status polling for reading status register 9 or referring to the ready/busy (RDY/BSY) terminal. Thereafter, a program for the next block or an operation for erasing the next block is executed.

A flash memory card having the conventional block erasable flash memory ICs mounted therein will now be described. Each of flash memory ICs, which has a memory capacity of 4M bits or more, is normally provided with a block erasing function. Now, a flash memory card having 8M bit flash memory ICs mounted therein will be described below.

Figure 8:
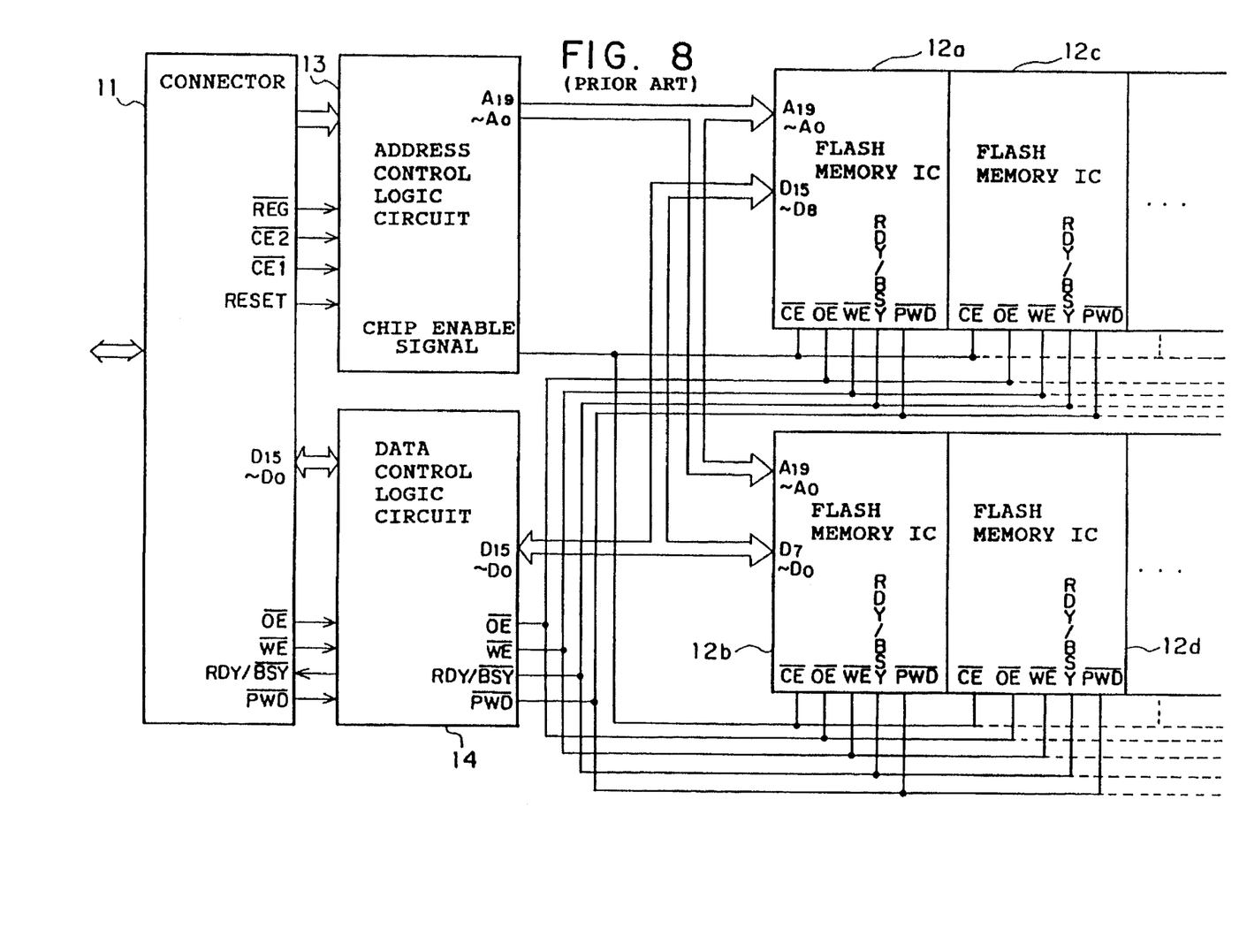
FIG. 8 is a view showing a configuration of a conventional flash memory card.

FIG. 8 is a view showing a configuration of a conventional flash memory card. In the same drawing, reference numeral 11 indicates a 68-pin connector for interfacing between systems based on PCMCIA2.0/JEIDA4.1 specifications. Reference numerals 12a, 12b, 12c, 12d, . . . respectively indicate block erasable flash memory ICs. Reference numeral 13 indicates an address control logic circuit for generating chip enable signals each indicative of a signal for selecting one of the flash memory ICs 12a, 12b, 12c, 12d, . . . to thereby designate an address for a memory IC to be accessed. Reference numeral 14 indicates a data control logic circuit for controlling the input of data therein and the outputting of it therefrom. The address control logic circuit 13 has an address buffer and a decode circuit incorporated therein. Further, the data control logic circuit 14 is provided with a data bus buffer and a data bus control circuit and controls the transfer of data between the internally-provided flash memory ICs.

Figure 9:
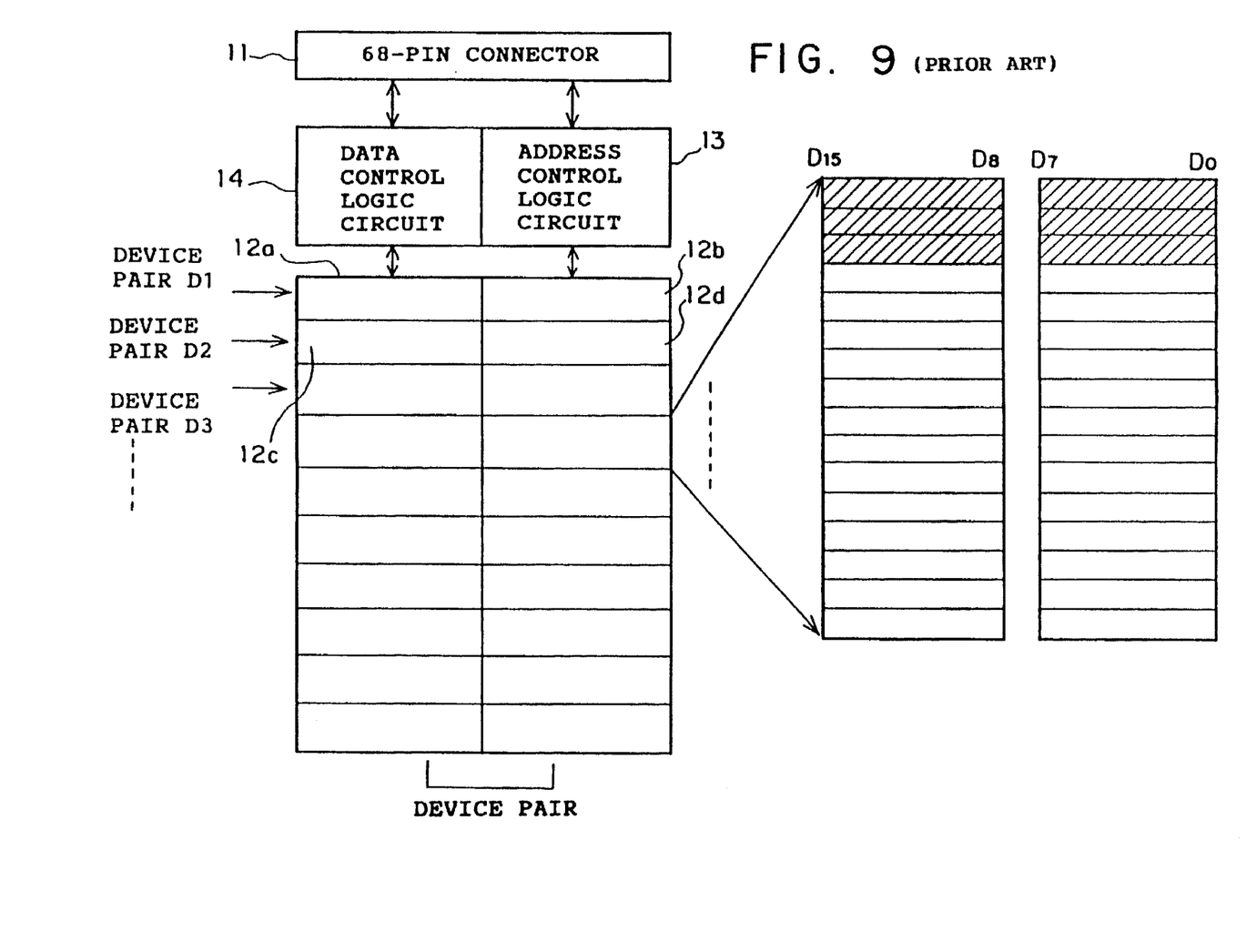
FIG. 9 is a view for describing block structures for every device pairs of the conventional flash memory ICs.

FIG. 9 is a view for describing block structures for every device pairs of the flash memory ICs 12a, 12b, 12c, 12d, . . . As shown in the same drawing, each of the flash memory ICs is divided into sixteen 64K byte blocks. Upon data access, the address control logic circuit 13 selects any of a one-word access, a one-byte access and an odd-numbered byte access from a table shown in FIG. 10 according to a combination of "H" and "L" of signals CE1 and CE2. In the case of a mode (1) in FIG. 10, the eight lower order bits of 16-bit data given from the outside are taken in the flash memory card as one-byte data. In the case of a mode (2) as well, the eight higher order bits of the 16-bit data given from the outside are taken in the eight lower order bits on a data bus provided inside the flash memory card as one-byte data. Further, in the case of a mode (3), the 16-bit data given from the outside is taken in the flash memory card as one-word data. Furthermore, in the case of a mode (4), the eight higher order bits of the 16-bit data given from the outside are taken in the eight higher order bits on the data bus provided inside the flash memory card as one-byte data.

In the conventional flash memory card having the aforementioned block erasable flash memory ICs mounted therein, there is often a case in which block pairs are consecutively used as indicated by oblique lines in FIG. 9, for example. When consecutive areas of 64K words or more in the same device pair are erased, the address control logic circuit 13 first specifies a block pair address to enable a device pair including the areas indicated by the oblique lines. Next, 64K byte block pairs, which belong to the areas indicated by the oblique lines of the enabled device pair, are erased one by one. When such erasure is completed, the following block pair is erased. The completion of its erasure can be judged by checking whether an internal operating state is ready or busy. During the block erase operation, the internal state is busy and each device pair at the time of the internal state being busy, cannot be accessed. Thus, other blocks in the same device pair cannot be erased.

Figure 11:
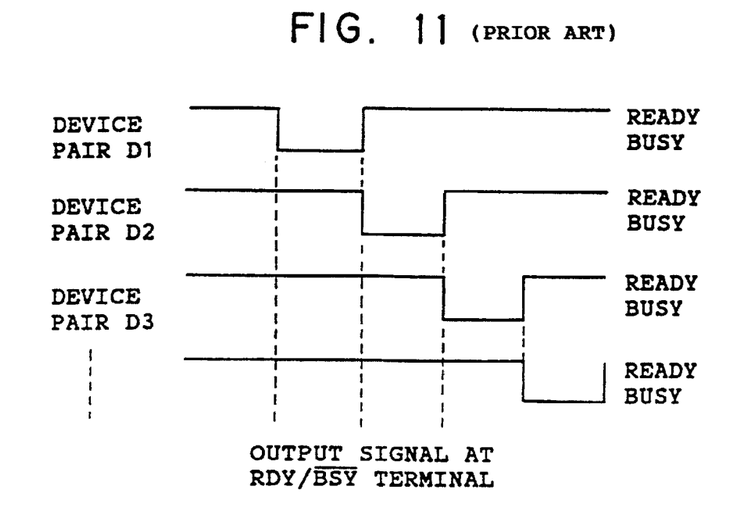
FIG. 11 is a view for describing signals which appear at ready/busy terminals of device pairs when three continuous block pairs employed in the conventional flash memory card are erased.

FIG. 11 is a view for describing output signals which appear at ready/busy terminals when a plurality of block pairs are erased. As shown in the same drawing, when one block pair is being erased, the ready/busy terminal is brought to "L", which shows a busy state. When the erase operation is completed, the ready/busy terminal is brought to "H" indicative of a ready state. The flash memory card enters into the next block pair erase operation when the ready/busy terminal is brought to "H." Therefore, when a plurality of block pairs are erased, the next block pair is erased as soon as the ready/busy terminal is brought to "H" upon erasing the previous block pair.

Therefore, the conventional flash memory card has a problem that when it is desired to erase the plurality of block pairs, the next block pair is erased after the ready/busy signal has been brought to "H" upon erasure of the previous block pair, thus requiring a lot of time for erasure of the block pairs.

SUMMARY OF THE INVENTION

With the foregoing problem in view, it is therefore an object of the present invention to provide a flash memory card capable of erasing blocks at a high speed.

The flash memory card according to the present invention comprises a data control logic circuit for controlling the transfer of data between the outside of the flash memory card and a plurality of flash memory devices through a connector and respectively transmitting block erase commands to the flash memory devices including physical blocks to be erased therein when the block erase commands associated with a plurality of consecutive logic blocks are inputted via the connector, and an address control logic circuit for managing addresses for the plurality of input continuous logic blocks so as to disperse into the plurality of flash memory devices by assigning the addresses to their corresponding addresses for the physical blocks of the plurality of flash memory devices and for respectively transmitting chip enable signals to at least two of the plurality of flash memory devices including the physical blocks to be erased in such a manner that when the block erase commands are inputted, a period in which the at least two flash memory devices are simultaneously busy, exists. Therefore, a block erase operation can be performed at a high speed.

In the flash memory card according to the present invention, the address control logic circuit converts the addresses for the plurality of consecutive logic blocks to their corresponding addresses for the physical blocks of the plurality of flash memory devices such that the addresses for the plurality of consecutive logic blocks are successively assigned to the plurality of flash memory devices one by one. Therefore, a high-speed block erase operation can be carried out.

In the flash memory card according to the present invention as well, inherent ID codes are assigned to the plurality of flash memory devices respectively. When block erase commands are inputted to the flash memory devices, the ID codes are checked together. The block erase commands are executed only when corresponding ID codes are found. The address control logic circuit simultaneously outputs the chip enable signals to a plurality of flash memory devices including physical blocks to be erased therein when block erase commands associated with a plurality of continuous logic blocks are inputted from the outside. The data control logic circuit sends the block erase commands to the plurality of flash memory devices including the physical blocks to be erased therein, together with the inherent ID codes. It is therefore possible to erase the blocks at a higher speed.

In the flash memory card according to the present invention, at least one of the plurality of flash memory devices has a file information storage area for storing therein the names of files and address information having the files stored thereat so that they are associated with each other. Further, a file management control means controls the address control logic circuit and the data control logic circuit such that when file erase commands are inputted from the connector together with the names of the files, the file information storage area is retrieved to erase areas storing the files of the above names. Therefore, the files can be erased by simply inputting the names of files to be erased.

The above and other objects, features and advantages of the present invention will become apparent from the following description and the appended claims, taken in conjunction with the accompanying drawings in which preferred embodiment of the present invention are shown by way of illustrative example.

DETAILED DESCRIPTION OF THE PREFERRED EMBODIMENTS

Preferred embodiments of the present invention will hereinafter be described in detail with reference to the accompanying drawings.

[First embodiment]

Figure 1:
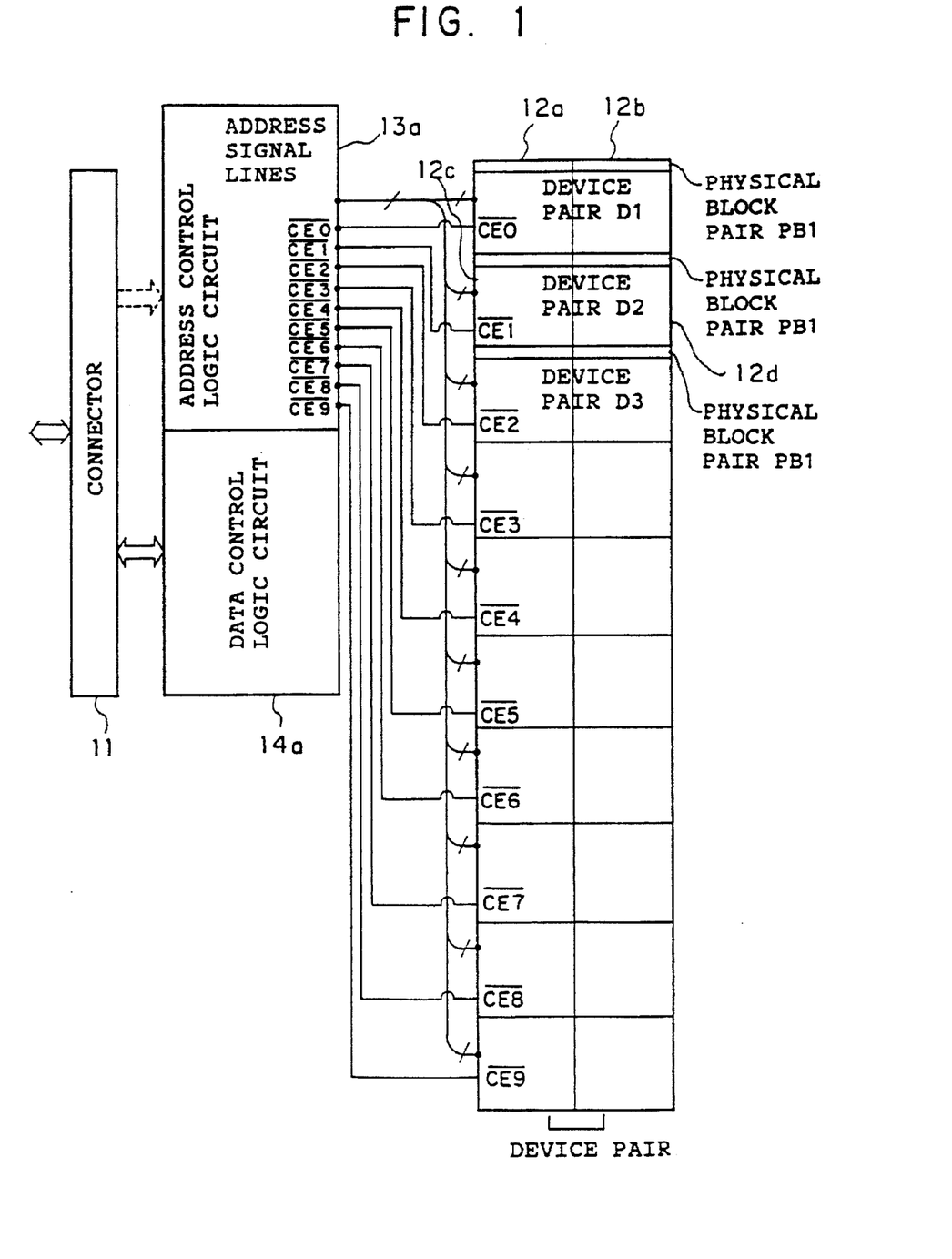
FIG. 1 is a view showing a configuration of a flash memory card according to a first embodiment of the present invention.
Figure 2:
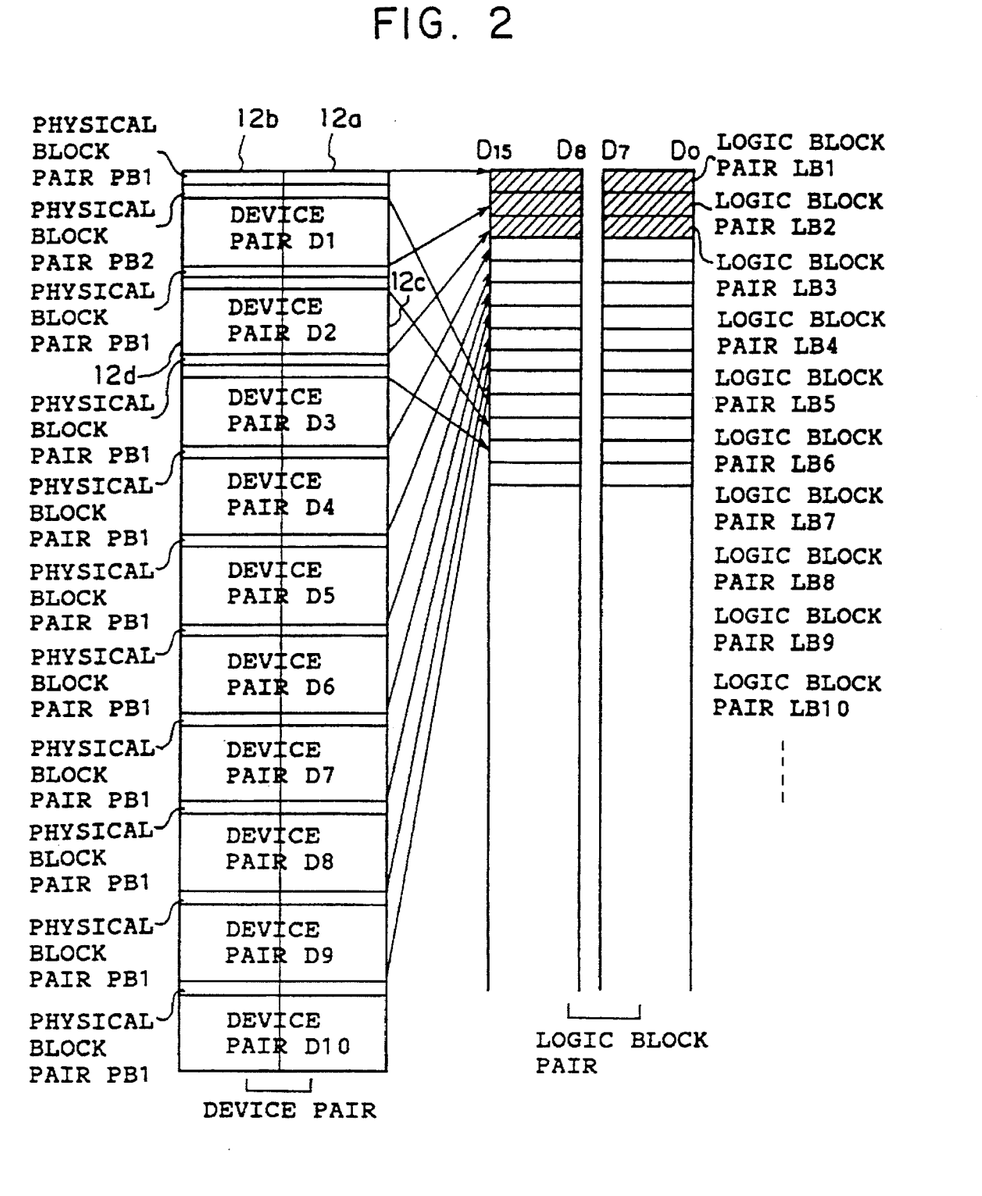
FIG. 2 is a view illustrating block structures in a memory array of flash memory ICs employed in a flash memory card according to a second embodiment of the present invention.
Figure 10:
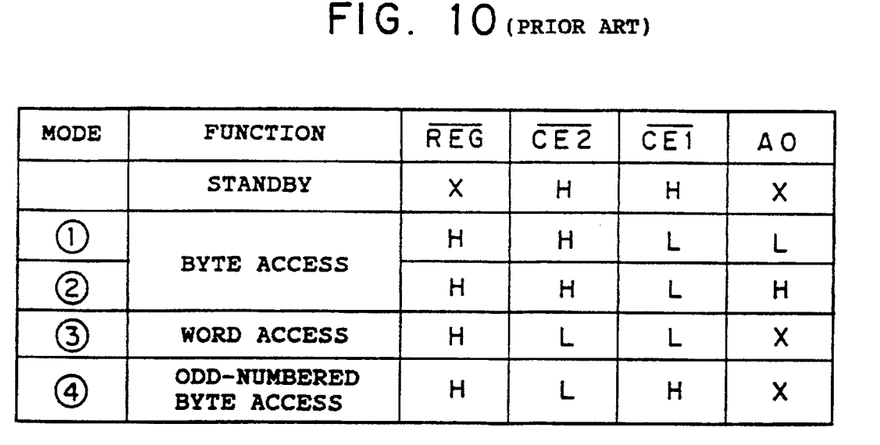
FIG. 10 is a table for describing access modes employed in the conventional flash memory card.

FIG. 1 is a view showing a configuration of a flash memory card according to the first embodiment of the present invention. FIG. 2 is view illustrating block structures in a memory array of flash memory ICs in the flash memory card. Referring to FIG. 1, the same elements as those shown in FIGS. 9 and 10 are identified by like reference numerals and the description of common elements will therefore be omitted. In FIG. 1, various signal lines are electrically connected to a 68-pin connector 11, flash memory ICs 12a, 12b, 12c, 12d, . . . , an address control logic circuit 13a, a data control logic circuit 14b to allow a transfer of data or the like thereamong as shown in FIG. 9. However, in the present embodiment, for convenience of explanation, only data address buses and chip enable signal lines are shown and the description of other signal lines such as data buses, etc. will be omitted. Incidentally, twenty 8-bit flash memories are used in the flash memory card. The two flash memories constitute a device pair and are capable of reading 16-bit data therefrom and writing it therein. Further, each flash memory IC is divided into 16 blocks of 64K byte. A block controlled by each flash memory IC will be called "physical block" in the present application and a pair of blocks will be called particularly "physical block pair." Further, blocks in the flash memory card, which are designated and accessed by a user, will be called "logic blocks" and a pair of blocks will be called especially "logic block pair."

The address control logic circuit 13a outputs a chip enable signal indicative of which device pair is selected based on an address inputted from the 68-pin connector 11. Further, the address control logic circuit 13a is provided with address decode circuit for supplying address signals to their corresponding device pairs. Furthermore, the address control logic circuit 13a generates physical addresses of individual device pairs from addresses of logic blocks respectively as shown in FIG. 2. When a block erase command is inputted from the 68-pin connector 11, the data control logic circuit 14a notifies the input block erase command to the address control logic circuit 13a. Upon receipt of the command by the address control logic circuit 13a, the address control logic circuit 13a performs address conversion according to the input command and controls each of chip enable signals CE0, CE1, . . . , CE9.

The operation of the flash memory card constructed as described above will now be described. First, the flash memory card causes the address control logic circuit 13a to perform the conversion of addresses between logic blocks and physical blocks of each device pair as shown in FIG. 2. Namely, a physical block pair PB1 of a device pair D1, a physical block pair PB1 of a device pair D2, a physical block pair PB1 of a device pair D3 are respectively taken so as to make a logic block pair LB1, a logic block pair LB2, a logic block pair LB3 in this order. Similarly, a physical block pair PB1 of a device pair D10 is set to a logic block pair LB10. Next, a physical block pair PB2 of the device pair D1 is set to a logic block pair LB11. In a manner similar to the above, physical block pairs are successively taken out from respective device pairs one by one below and are used as a sequence of logic block pairs.

The operation of erasing the blocks in the flash memory card constructed as described above will now be described. There is generally often a case in which logically consecutive block pairs are accessed upon writing data or erasing it. Now, consider the case where the three continuous logic block pairs LB1, LB2 and LB3 indicated by oblique lines in FIG. 2, for example, are erased.

First, through the 68-pin connector 11, a block erase command is sent to the address control logic circuit 13a designating an address for the logic block pair LB1. Thereafter, the address control logic circuit 13a outputs a chip enable signal to the device pair D1 to enable the device pair D1. Further, the data control logic circuit 14a sends a block erase command for the physical block pair PB1 to the device pair D1. In doing so, the device pair D1 executes a block erasure of the physical block pair PB1. Next, through the 68-pin connector 11, a block erase command is sent to the address control logic circuit 13a designating an address for the logic block pair LB2. In response to the block erase command, the address control logic circuit 13a first outputs a chip enable signal to the device pair D2 to enable the device pair D2. Thereafter, the data control logic circuit 14a transmits a block erase command for the physical block pair PB1 to the device pair D2. In doing so, the device pair D2 executes a block erasure of the physical block pair PB1. Subsequently, through the 68-pin connector 11, a block erase command to the address control logic circuit 13a designating an address for the logic block pair LB3. Thus, the address control logic circuit 13a first outputs a chip enable signal to the device pair D3 to enable the device pair D3. Thereafter, the data control logic circuit 14a sends a block erase command for the physical block pair PB1 to the device pair D3.

Namely, since the device pair D1 is busy during a period in which blocks in a certain physical block pair PB1 of the device pair D1, for example, are being erased, blocks in other physical block pairs of the device pair D1 cannot be erased. However, other device pairs can be accessed. Thus, device pairs including physical block pairs corresponding to logic block pairs set subsequently by assigning the consecutive logic block pairs to the separate device pairs as described above are successively enabled to erase blocks.

Figure 3:
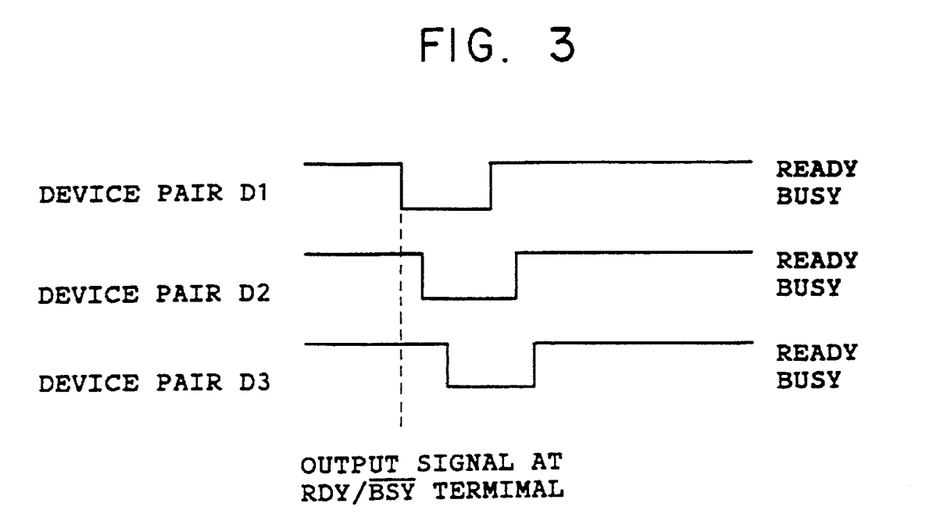
FIG. 3 is a view for describing signals which appear at ready/busy terminals of device pairs when three continuous logic block pairs employed in the first embodiment are erased.

FIG. 3 is a view for describing signals which appear at ready/busy terminals of the device pairs D1, D2 and D3 when the aforementioned logic block pairs LB1, LB2 and LB3 are block-erased. As shown in FIG. 3, at least two of the device pairs D1, D2 and D3 respectively have periods in which the two are simultaneously block-erased and become busy. Thus, high-speed processing can be executed. In the present embodiment, all the device pairs D1, D2 and D3 respectively have periods in which they are simultaneously block-erased and become busy in practice as shown in the same drawing.

In the above description, the flash memory devices are paired so as to configure the device pairs, the physical block pairs and the logic block pairs. However, the flash memory devices may be singly used without using the flash memory devices in pairs to configure a 8-bit block flash memory card.

[Second embodiment]

The present embodiment is identical in basic configuration to the first embodiment. However, the present embodiment is different from the first embodiment in terms of the following.

Figure 4:
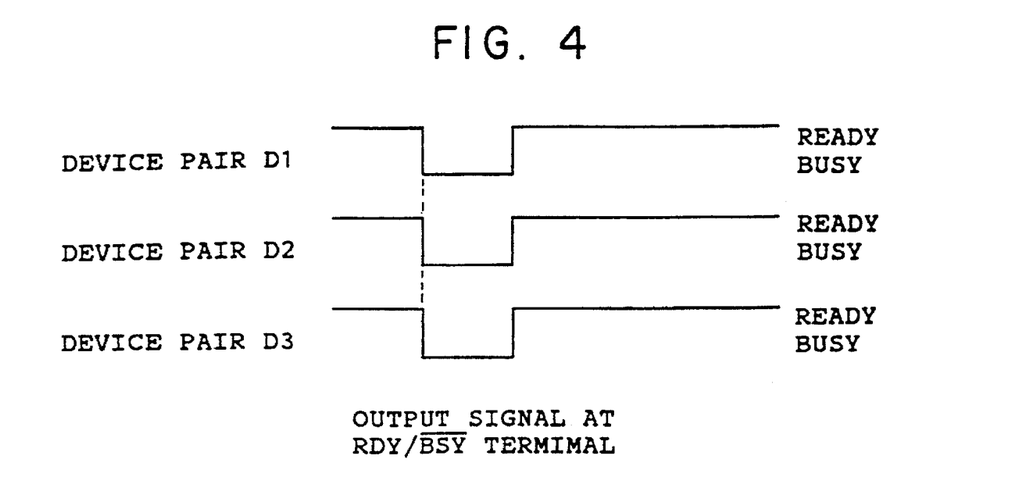
FIG. 4 is a view for describing signals which appear at ready/busy terminals of device pairs when three continuous logic block pairs employed in the second embodiment are erased.

Namely, in the present embodiment, when block erase commands for a plurality of logic block pairs are inputted from the outside through the 68-pin connector 11, the address control logic circuit 13a simultaneously enables device pairs including physical block pairs corresponding to a plurality of logic block pairs to be erased to thereby perform block erase processing on the respective device pairs. FIG. 4 is a view for describing signals which appear at ready/busy terminals of device pairs D1, D2 and D3 when the logic block pairs LB1, LB2 and LB3 described in the first embodiment are block-erased. As shown in the same drawing, the respective device pairs D1, D2 and D3 are simultaneously enabled so as to execute block erase operations in physical block pairs specified by the address control logic circuit 13a. In this case, a plurality of device pairs are simultaneously selected and each physical block pair is specified by the address control logic circuit 13a. However, this mere processing makes it unable to specify to which device pair the physical block pair corresponds. Therefore, specific ID codes are assigned to the respective device pairs. Further, the data control logic circuit 14a outputs the ID codes to their corresponding device pairs to specify to which device pairs erase commands for physical block pairs correspond respectively.

Since the physical block pairs in the respective device pairs are simultaneously block-erased in the present embodiment, the blocks can be erased at a very high speed.

[Third embodiment]

Figure 5:
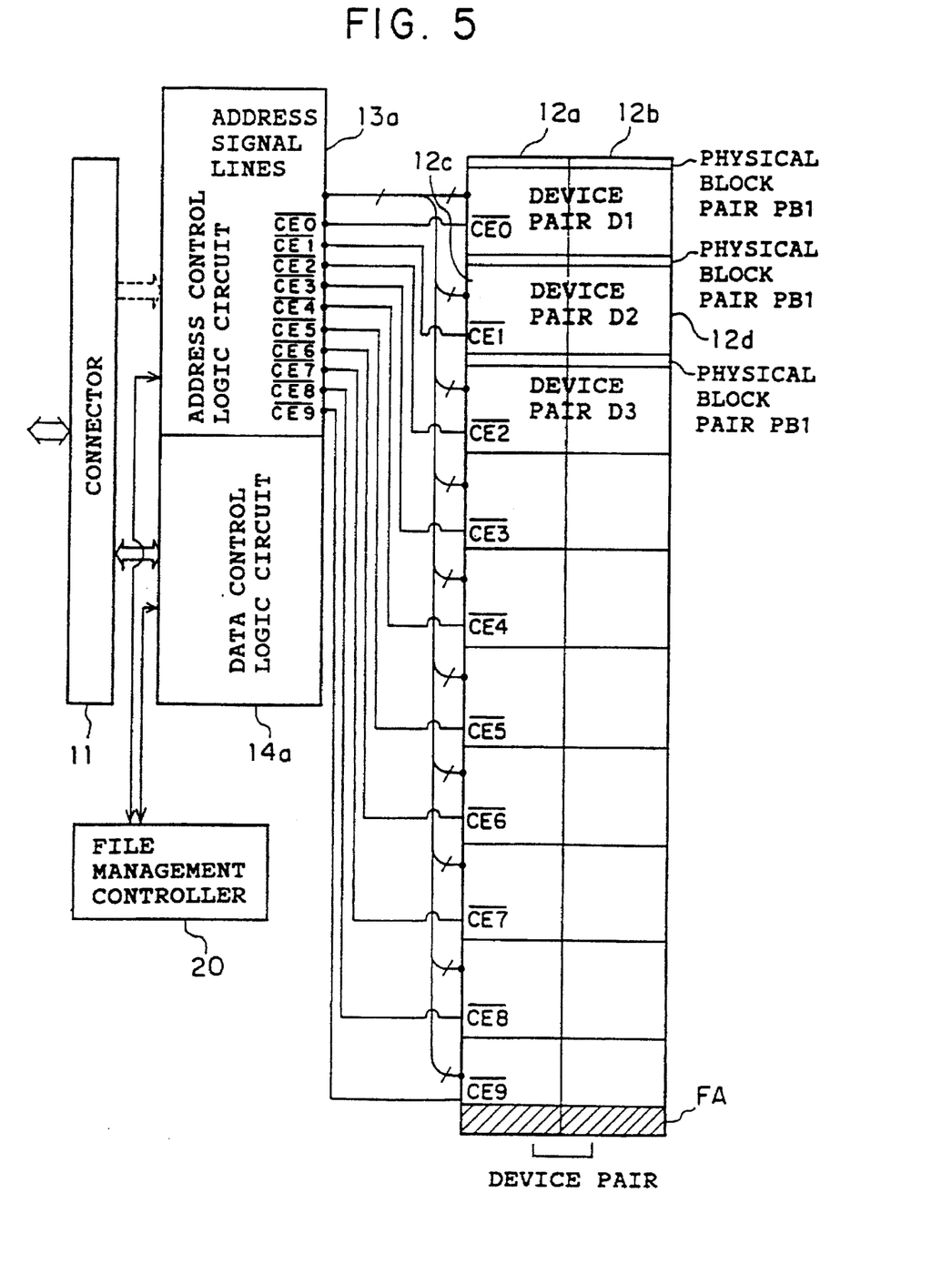
FIG. 5 is a view showing a configuration of a flash memory card according to a third embodiment of the present invention.

FIG. 5 is a view showing a configuration of a flash memory card according to the third embodiment of the present invention. In the present embodiment as shown in the drawing, a filing area FA storing filing information such as names of files, device pairs in which the files are stored and storage addresses are provided within a part of a flash memory IC. Further, a file management controller 20 is provided for erasing a file specified based on the filing information stored in the filing area FA. Incidentally, the same elements as those shown in FIG. 1 are identified by like reference numerals and the description of common elements will therefore be omitted.

The operation of the aforementioned flash memory card will now be described. Names of files, device pairs storing the files and physical addresses are stored in association with one another from the outside of the flash memory card via a connector 11. Next, when the name of a file and an erase command are inputted from the outside of the flash memory card, the file management controler 20 controls an address control logic circuit 13a and a data control logic circuit 14a to retrieve the filing information stored in the filing area FA. When a device pair storing that file therein and a physical address are specified as a result of its retrieval, the file management controller 20 controls the address control logic circuit 13a and the data control logic circuit 14a to enable the specified device pair so as to execute an operation for erasing an area to be erased.

Incidentally, the names of files, device pairs and the files and physical block pairs may be stored in the filing area FA in association with one another. In this case, the file management controller 20 enables a specified device pair to block-erase each physical block pair. Particularly when a plurality of physical block pairs should be erased, a plurality of device pairs simultaneously perform block erase operations as described in the first and second embodiments.

Further, the logic block pairs and the physical block pairs are introduced as described in the first embodiment using FIG. 2 and the names of files and a physical block pair storing the files may be stored in the filing area FA. In this case, the file management controller 20 controls the address control logic circuit 13a and the data control logic circuit 14a to enable a specified device pair to block-erase each logic block pair. When a plurality of logic block pairs should be erased, a plurality of device pairs can simultaneously block erase operations as described in the first and second embodiments. Owing to the provision of the filing area FA and the file management controller 20 in this way, a file can be erased by simply specifying the name of the file and executing an erase command.

Incidentally, the first through third embodiments described above can be also practiced in combination with each other.

Having now fully described the invention, it will be apparent to those skilled in the art that many changes and modifications can be made without departing from the spirit or scope of the invention as set forth herein.

What is claimed is:

1. A flash memory card having a plurality of flash memory devices each of which is divided into a plurality of physical blocks, comprising:

a connector for connecting said flash memory card to an external device;

a data control logic circuit for controlling a transfer of data between the outside of said flash memory card and the plurality of flash memory devices through said connector and respectively transmitting block erase commands to the flash memory devices including the physical blocks to be erased when the block erase commands associated with a plurality of consecutive logic blocks are inputted via said connector; and an address control logic circuit for managing addresses for the plurality of consecutive logic blocks inputted via said connector so as to disperse into the plurality of flash memory devices by assigning the addresses to their corresponding addresses for the physical blocks of the plurality of flash memory devices and for respectively transmitting chip enable signals to at least two device pairs of the plurality of flash memory devices including the physical blocks to be erased in such a manner that when the block erase commands are externally inputted via said connector, a period in which said at least two device pairs are simultaneously busy, exists.

2. The flash memory card according to claim 1, wherein said address control logic circuit respectively converts the addresses for the plurality of consecutive logic blocks the addresses for the physical blocks of the plurality of flash memory devices such that the addresses for the plurality of consecutive logic blocks are successively assigned to the plurality of flash memory devices one by one.

3. The flash memory card according to claim 1, wherein each of the plurality of flash memory devices has an inherent ID code assigned thereto, checks an ID code when the block erase commands are inputted to the flash memory devices, and executes a block erase command only when an inputted ID code coincides with the inherent ID code in each flash memory device, said address control logic circuit simultaneously outputs the chip enable signals to the plurality of flash memory devices including the physical blocks to be erased when the block erase commands associated with a plurality of consecutive logic blocks are inputted from the outside, and said data control logic circuit sends the block erase commands respectively to the plurality of flash memory devices including the physical blocks to be erased together with the inherent ID codes.

4. The flash memory card according to claim 2, wherein each of the plurality of flash memory devices has an inherent ID code assigned thereto, checks an ID code when the block erase commands are inputted to the flash memory devices, and executes a block erase command only when an inputted ID code coincides with the inherent ID code in each flash memory device, said address control logic circuit simultaneously outputs the chip enable signals to the plurality of flash memory devices including the physical blocks to be erased when the block erase commands associated with a plurality of consecutive logic blocks are inputted from the outside, and said data control logic circuit sends the block erase commands respectively to the plurality of flash memory devices including the physical blocks to be erased together with the inherent ID codes.

5. The flash memory card according to claim 1, wherein at least one of the plurality of flash memory devices has a file information storage area for storing therein names of files and address information at which the files are stored such that the files are associated with each other, and the flash memory card further includes file management control means for controlling said address control logic circuit and said data control logic circuit such that when file erase command is inputted from said connector together with the name of a file, the file information storage area is retrieved and an area storing the file having the name is erased.

6. The flash memory card according to claim 2, wherein at least one of the plurality of flash memory devices has a file information storage area for storing therein names of files and address information at which the files are stored such that the files are associated with each other, and the flash memory card further includes file management control means for controlling said address control logic circuit and said data control logic circuit such that when file erase command is inputted from said connector together with the name of a file, the file information storage area is retrieved and an area storing the file having the name is erased.

7. The flash memory card according to claim 3, wherein at least one of the plurality of flash memory devices has a file information storage area for storing therein names of files and address information at which the files are stored such that the files are associated with each other, and the flash memory card further includes file management control means for controlling said address control logic circuit and said data control logic circuit such that when file erase command is inputted from said connector together with the name of a file, the file information storage area is retrieved and an area storing the file having the name is erased.

8. A flash memory card having a plurality of flash memory devices each of which is divided into a plurality of physical blocks, comprising:

a connector for connecting said flash memory card to an external device;

a data control logic circuit for controlling a transfer of data between the outside of said flash memory card and the plurality of flash memory devices through said connector and respectively transmitting block erase commands to the flash memory devices including the physical blocks to be erased when the block erase commands associated with a plurality of consecutive logic blocks are inputted via said connector;

an address control logic circuit for managing addresses for the plurality of consecutive logic blocks inputted via said connector; and file management control means for controlling said address control logic circuit and said data control logic circuit;

wherein at least one of the plurality of flash memory devices has a file information storage area for storing therein names of files and address information at which the files are stored such that the files are associated with each other, and the file management control means controls the address control logic circuit and the data control logic circuit such that when file erase command is inputted from said connector together with the name of a file, the file information storage area is retrieved and an area storing the file having the name is erased.

9. A flash memory card according to claim 8, wherein said address control logic circuit manages the addresses so as to disperse into the plurality of flash memory devices by assigning the addresses to their corresponding addresses for the physical blocks of the plurality of flash memory devices and respectively transmits chip enable signals to at least two of the plurality of flash memory devices including the physical blocks to be erased in such a manner that when the block erase commands are externally inputted via said connector, a period in which said at least two flash memory devices are simultaneously busy, exists.

10. The flash memory card according to claim 8, wherein said address control logic circuit respectively converts the addresses for the plurality of consecutive logic blocks to the addresses for the physical blocks of the plurality of flash memory devices such that the addresses for the plurality of consecutive logic blocks are successively assigned to the plurality of flash memory devices one by one.

11. The flash memory card according to claim 8, wherein each of the plurality of flash memory devices has an inherent ID code assigned thereto, checks an ID code when the block erase commands are inputted to the flash memory devices, and executes a block erase command only when an inputted ID code coincides with the inherent ID code in each flash memory device, said address control logic circuit simultaneously outputs chip enable signals to the plurality of flash memory devices including the physical blocks to be erased when the block erase commands associated with the plurality of consecutive logic blocks are inputted from the outside, and said data control logic circuit sends the block erase commands respectively to the plurality of flash memory devices including the physical blocks to be erased together with the inherent ID codes.

12. A flash memory card having a plurality of flash memory devices each of which is divided into a plurality of physical blocks, comprising:

a connector for connecting said flash memory card to an external device;

a data control logic circuit for controlling a transfer of data between the outside of said flash memory card and the plurality of flash memory devices through said connector and respectively transmitting block erase commands to the flash memory devices including the physical blocks to be erased when the block erase commands associated with a plurality of consecutive logic blocks are inputted via said connector; and an address control logic circuit for managing addresses for the plurality of consecutive logic blocks inputted via said connector;

wherein each of the plurality of flash memory devices has an inherent ID code assigned thereto, checks an ID code when the block erase commands are inputted to the flash memory devices, and executes a block erase command only when an inputted ID code coincides with the inherent ID code in each flash memory device, said address control logic circuit simultaneously outputs chip enable signals to the plurality of flash memory devices including the physical blocks to be erased when the block erase commands associated with the plurality of consecutive logic blocks are inputted from the outside, and said data control logic circuit sends the block erase commands respectively to the plurality of flash memory devices including the physical blocks to be erased together with the inherent ID codes.

13. A flash memory card according to claim 12, wherein said address control logic circuit manages the addresses so as to disperse into the plurality of flash memory devices by assigning the addresses to their corresponding addresses for the physical blocks of the plurality of flash memory devices and respectively transmits the chip enable signals to at least two of the plurality of flash memory devices including the physical blocks to be erased in such a manner that when the block erase commands are externally inputted via said connector, a period in which said at least two flash memory devices are simultaneously busy, exists.

14. The flash memory card according to claim 12, wherein said address control logic circuit respectively converts the addresses for the plurality of consecutive logic blocks to the addresses for the physical blocks of the plurality of flash memory devices such that the addresses for the plurality of consecutive logic blocks are successively assigned to the plurality of flash memory devices one by one.

15. The flash memory card according to claim 12, wherein at least one of the plurality of flash memory devices has a file information storage area for storing therein names of files and address information at which the files are stored such that the files are associated with each other, and the flash memory card further includes file management control means for controlling said address control logic circuit and said data control logic circuit such that when file erase command is inputted from said connector together with the name of a file, the file information storage area is retrieved and an area storing the file having the name is erased.

* * * * *